United States Patent [19]

Straw et al.

[11] Patent Number: 5,729,171
[45] Date of Patent: Mar. 17, 1998

[54] PREAMPLIFIER WITH ADJUSTABLE INPUT RESISTANCE

[75] Inventors: Timothy B. Straw, New London; Patricia M. Eno, Noank, both of Conn.

[73] Assignee: The United States of America as represented by the Secretary of the Navy, Washington, D.C.

[21] Appl. No.: 891,119

[22] Filed: Jun. 1, 1992

[51] Int. Cl.$^6$ ........................................... H03B 1/00
[52] U.S. Cl. ........................ 327/581; 327/553; 327/559
[58] Field of Search ................................ 307/520, 521, 307/490, 264, 304; 327/551, 552, 553, 555, 558, 559, 581, 50, 63

[56] References Cited

PUBLICATIONS

"Microelectronics Circuits", Sedra et al., CB5 College Publishing, 2nd edition, '87 pp. 332–333.
"The Art of Electronics", Horowitz et al., Cambridge University Press, 1980, pp. 240–241.

*Primary Examiner*—Toan Tran
*Attorney, Agent, or Firm*—Michael J. McGowan; Michael F. Oglo; Prithvi C. Lall

[57] ABSTRACT

A monolithic CMOSFET integrated circuit which includes a first MOSFET integrant transistor having a gate area chosen to provide a desired range of resistance when operated in its triode region which constitutes (i) a preamplifier, (ii) a voltage controlled resistance (VCR) device, and (iii) a high-pass filter when capacitive with a transducer. Preferred operating characteristics are achieved by including an active CMOSFET linearization network including a pair of second and third integrant MOSFET transistors having only one-hundredth (1/100th) to one-tenth (1/10th) the gate area of the first transistor. The present invention operates with a reduction in distortion resulting from the filtering effect of the combined capacitive reactance of the sensor and the resistance of the resistor. This reduction in distortion occurs at frequencies greater than the corner frequency (the frequency which is equal to the inverse product of the capacitance in farads times the resistance in ohms) and is due to the high-pass filter formed by the sensor and the resistor. Stated in terms of well known capacitor-resistor pole theory, the high-pass filter effect is based upon the "transducer capacitance-preamplifier input resistance pole" (i.e., such "pole" with reference to the capacitance characteristic of the capacitive transducer and the preamplifier input resistance provided by a CMOSFET I.C. device or devices as aforesaid). This distortion is less than that which would have been expected as a consequence of the non-linearity of prior art MOSFET VCRS. Due to this high pass filter effect, the distortion rolls off at approximately 20 db/decade of frequency.

2 Claims, 3 Drawing Sheets

PREAMPLIFIER WITH ADJUSTABLE INPUT RESISTANCE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

(1) Field of Invention

The present invention relates to the low distortion amplification of low level electrical signals, signals provided by a capacitive sensor for example, and particularly to the matching of the biasing resistance at the input of a preamplifier to the high impedance of a capacitive transducer. More specifically, this invention is directed to a preamplifier characterized by an adjustable high value input resistance and especially to such an amplifier which is further characterized by linearity, minimum size and a good degree of temperature stability within its operating range. Accordingly, the general objects of the present invention are to provide novel and improved methods and apparatus of such character.

(2) Description of the Prior Art

While not limited thereto in its utility, the present invention is particularly well suited for use with capacitive transducers. Such transducers find use in microphones, accelerometers, hydrophones, proximity detectors and in the measurement of pressure. In demanding applications, such as sonar systems, the low level signal provided by a capacitive transducer must be amplified without excess distortion, and in such a manner as to provide an output signal having a high signal to noise ratio. In order to achieve the desired linearity, the biasing or input resistance to the amplifier is matched to the characteristically high impedance of the transducer at the nominal expected frequency of the transducer output signal.

In the prior art, preamplifiers for use with capacitive transducers have been fabricated employing discrete resistors. Obviously, if a single preamplifier design is to be used with a number of similar but different transducers, the amplifier input resistance must be adjustable. The use of discrete resistors, especially potentiometers (adjustable resistors), places a limit on the degree of miniaturization which can be achieved. Miniaturization is desirable for most applications and is required in many situations.

It is to be noted that the miniaturization alluded to above cannot be achieved by employing conventional integrated circuit resistors which can be fabricated on the same integrated circuit as the preamplifier. It is well known that such integrated circuit resistors, in addition to lacking adjustability, suffer from a combination of low sheet resistivity, poor absolute tolerance, and poor temperature stability.

It is also known that a metal oxide semiconductor (MOS) field effect transistor, hereinafter MOSFET, can be operated as a voltage controlled resistor (VCR). However, it is equally well known that a MOSFET resistor is a non-linear device, a distortion of 7% having been reported in one reduction to practice discussed in the published literature. Thus, those skilled in the art are aware that the output resistance of a MOSFET voltage controlled resistor varies as a function of both the magnitude of the input signal and the magnitude of the control voltage. Due to the lack of linearity, a MOSFET VCR would not appear to be a viable choice as a biasing resistor for a preamplifier associated with a capacitive transducer.

SUMMARY OF THE INVENTION

The present invention overcomes the above briefly discussed deficiencies and other disadvantages of the prior art and, in so doing, employs a metal oxide semiconductor field effect transistor operated in the triode region to approximate a linear input resistance for a preamplifier employed with a capacitive transducer. The present invention thus encompasses the unobvious use of a device known to be non-linear in an application where the prior art has universally attempted to achieve linearization. The invention is based upon the discovery that the distortion of an amplified capacitive transducer output signal can be maintained within an acceptable range when the capacitive transducer and a non-linear MOSFET resistance combine to form a high-pass filter which, in effect, masks non-linearities.

BRIEF DESCRIPTION OF THE DRAWINGS

The present invention may be better understood and its numerous objects and advantages will become apparent to those skilled in the art by reference to the accompanying drawings, wherein like reference numerals refer to like elements in the several figures, in which.

DESCRIPTION OF THE PREFERRED EMBODIMENT

Figure 1:
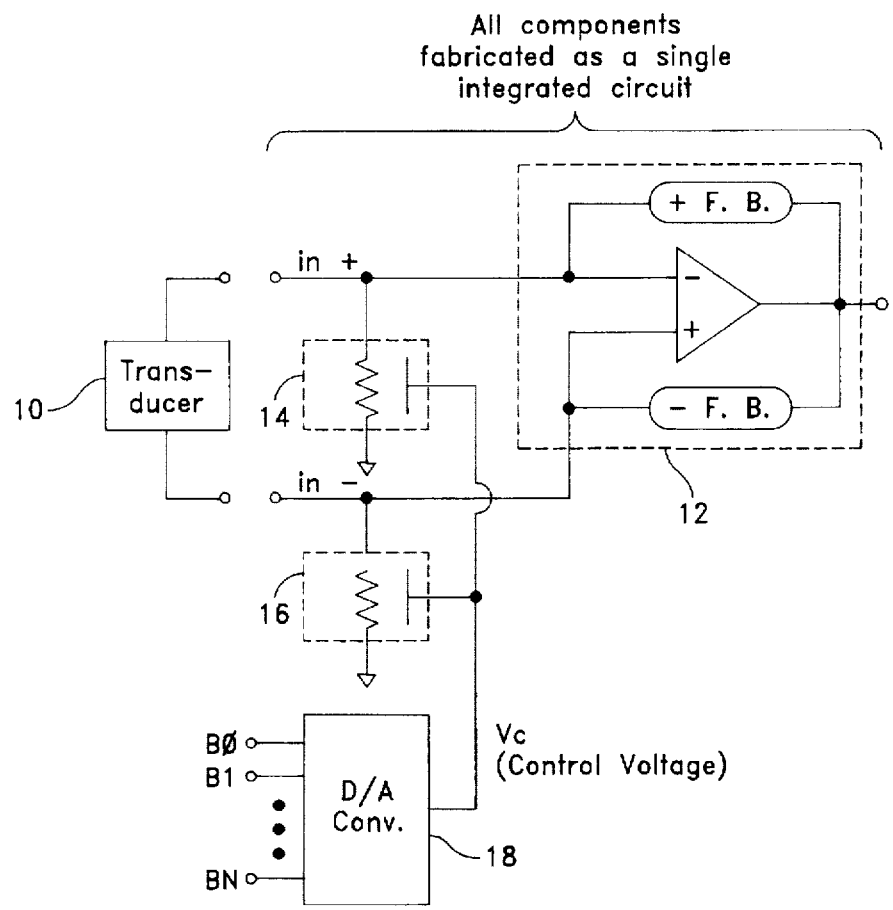
FIG. 1 is a schematic showing of a preamplifier in accordance with a first embodiment of the invention, the amplifier of FIG. 1 employing a pair of MOSFET voltage controlled resistors connected to the input terminals.

With reference to FIG. 1, a capacitive transducer is indicated generally at 10. Transducer 10 is characterized by a high impedance. The invention is of special utility for application in naval underwater acoustics. More particularly, it is of special utility as a component for preamplifier stages following hydrophones having impedances of the order of 10 to 1000 picofarads in order to linearize the preamplifier circuit. The impedance of the transducer should be matched by the preamplifier input resistance. In a typical application, the preamplifier input resistance will be in the range of 1 to 100 megohms. The preamplifier, less the input resistance, is indicated generally at 12. The preamplifier may be of conventional design and thus is depicted in the drawing simply in block form. Preamplifier 12 will typically be provided with both positive and negative feedback in the interest of enhancing linearity and insuring a high signal-to-noise ratio.

A voltage controlled resistor (VCR), and more specifically a MOSFET integrated circuit (I.C.) device implementation of a VCR resistor, is connected between each input terminal of preamplifier 12 and ground potential. These MOSFET I.C. device voltage controlled resistors are schematically illustrated in FIG. 1 at 14 and 16. In the disclosed embodiment, a digital-to-analog convertor 18 provides a control voltage $V_c$ for controlling the resistance of the MOSFET I.C. device VCRs 14 and 16.

Figure 2:
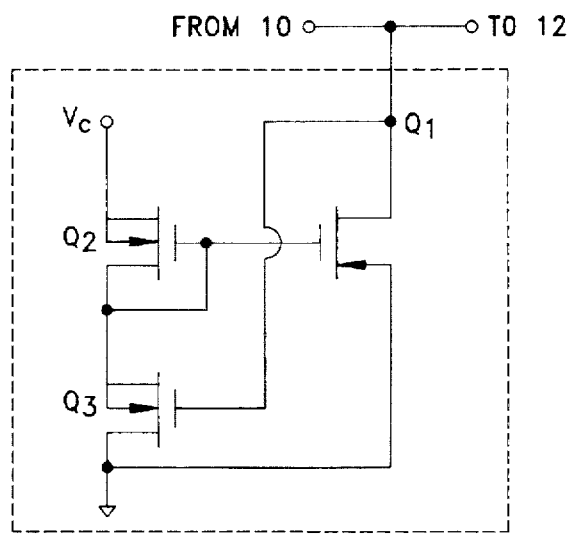
FIG. 2 is a schematic illustration of a linearized MOSFET resistor for use in the FIG. 1 embodiment.

Referring to FIG. 2, each of MOSFET I.C. (integrated circuit) device VCRs 14 and 16 of the FIG. 1 embodiment comprises an a component of the device, namely a MOSFET transistor Q1, operated in the triode region to approximate a linear resistor. This mode of operation of a MOSFET is well known in the art. By employing the 2 micron, 2 poly complementary metal oxide semiconductor (CMOS) process for fabrication of CMOSFET I.C. (integrated circuit) devices, designs of components of the device, namely MOSFET transistors can be provided which can achieve a resistivity in excess of 40K ohm "per square" when operated in the triode region. As used herein, the term "per square" refers to gate area expressed in multiples of a square unit of area with each side of the square equal to the minimum channel width providable by the monolithic integrated circuit fabrication process employed. For purposes of usage of this term in the present specification, it will be assumed that the process to be employed is a 2 micron, 2 poly complementary metal oxide semiconductor (CMOS) fabrication process providing a minimum channel width of 6 μm. Thus, for purposes of this specification and the appended claims, "one square" is 6 μm×6 μm or 36 μm². As will be apparent from the conventional symbols employed in the drawing, MOSFET Q1 is of the p-enhancement (penh) type of metal oxide semiconductor field effect transistor (MOSFET) device. The resistivity, and thus the actual resistance of the device, is a function of transistor device's gate size in numbers of "squares" and the amplitude of control voltage $V_c$. The resistance of a given MOSFET I.C. device VCR, accordingly, can be adjusted by varying control voltage $V_c$. Additionally, a MOSFET I.C. device VCR is characterized by acceptable distortion. In one reduction to practice, the harmonic distortion was measured to be 0.014%.

Continuing to refer to FIG. 2, when one side of the MOSFET resistor 14 is grounded as shown, a three transistor structure may be employed to realize first-order linearization. The transistors which are employed for linearization are indicated at Q2 and Q3 in FIG. 2. Such linearization is discussed in an article by Banu and Tsividis, entitled "Fully Integrated Active RC Filters in MOS Technology", which appeared in the *IEEE Journal of Solid State Circuits*, Vol. SC-18, No. 6, December 1983, pages 644–651 of which are hereby incorporated herein by reference. Reference may further be had to the text *Analog MOS Integrated Circuits for Signal Processing*, by Geogorian and Temes, published by Wiley in 1986, and particularly Section 5.9 entitled "Integrated Active-RC Filters Using MOSFET Resistors", which appears at pages 387–404, which are hereby incorporated herein by reference.

Figure 3:
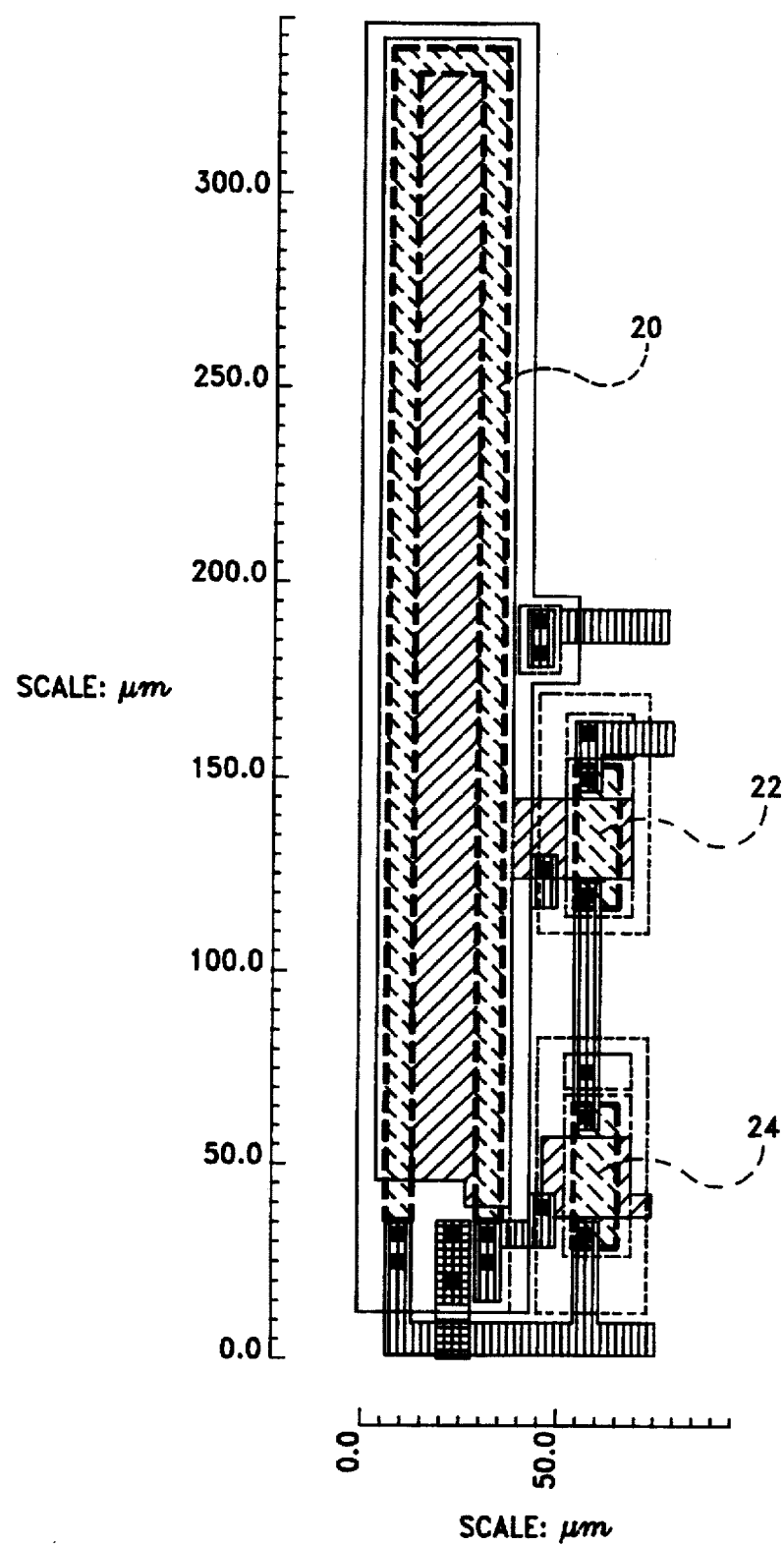
FIG. 3 is a diagrammatic view of the actual integrated circuit layout of the resistor of FIG. 2.

FIG. 3 shows the physical layout of a MOSFET VCR suitable for use in the practice of the invention. The actual size of the integrated circuit of FIG. 3 was approximately 80 μm×330 μm (3.1 milli-inches×13 milli-inches). It is to be appreciated that the 80 μm×330 μm CMOSFET layout area is sufficient to implement 600×6 microns of gate area for integrant transistor Q1 (which with a standard range of control voltages $V_c$ yields 12.0 megohms of VCR output), and also to include gate areas of 20×10 microns for integrant transistors Q2 and Q3 which provides effective first order linearization. The relative sizes of the gate areas of transistors Q1, Q2, and Q3 may be seen in FIG. 3 where they are respectively identified by broken lines 20, 22, and 24. It will be appreciated that one of the inventive aspects of the present invention is the discovery that (i) the implementation by means of CMOSFET technology of a voltage controlled resistor (VCR) I.C. device which provides a 12.0 megohm level of resistance, and (ii) the implementation of first order linearization of operation of this VCR device by means of such CMOSFET technology (i.e., using multiple transistor I.C. device layouts), can be achieved with a CMOSFET I.C. device layout in which the gate areas of the linearization transistors are of the order of one-tenth to one-hundredth of the gate area which determines level of resistance. Hence, the VCR I.C. device is implementable in a convenient to process configuration, such as that shown in FIG. 3. Transistors Q2 and Q3 are of the n-enhancement (nenh) type MOSFET, with Q2 configured with its source and back gate connected to the control voltage source $V_c$ and its gate connected to the gate of transistor Q1, and with Q3 configured with its drain connected to ground and its source and back gate connected to the gate of transistor Q1. It will be understood by those skilled in the art that these gate areas actually underlie a coating layer.

Figure 4:
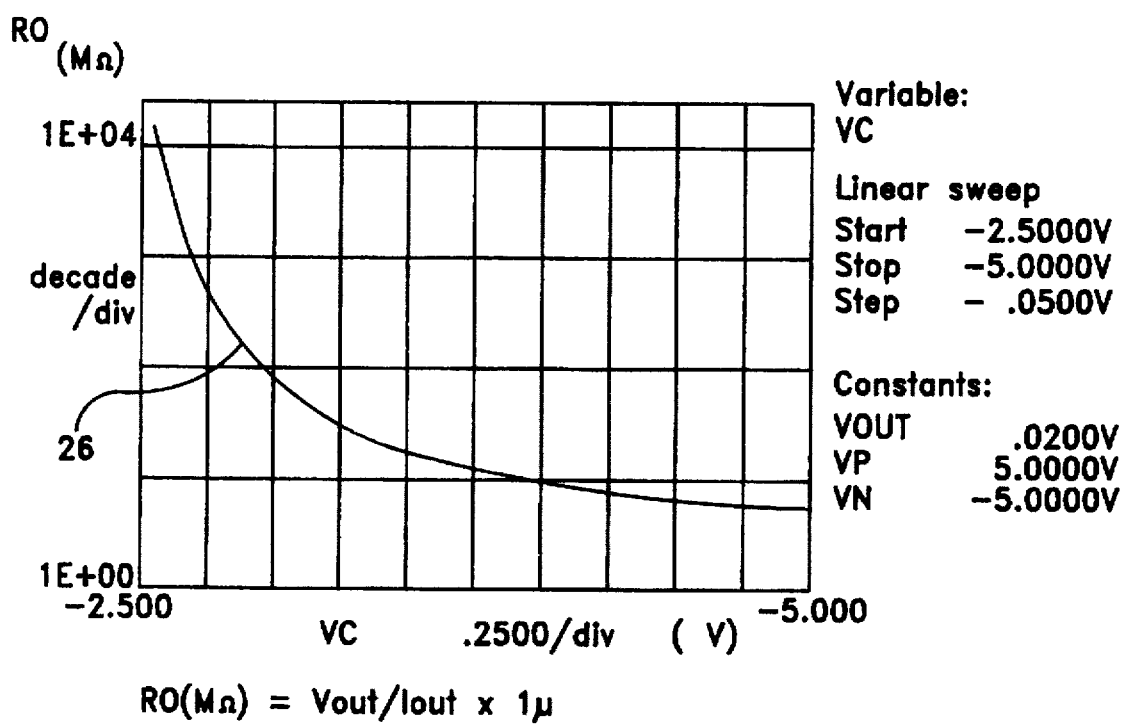
FIG. 4 is a graphical showing of the relationship between resistance and control voltage for the resistor of FIG. 2.

FIG. 4 depicts a graphical representation of the resistance of the integrated circuit of FIG. 3 versus control voltage $V_c$ for a CMOSFET VCR embodied by a transistor Q1 having a 600 μm×6 μm gate size and linearization transistors Q2 and Q3 having 20 μm×10 μm gate sizes.

A principal advantage of the present invention resides in the reduction in distortion resulting from the filtering effect of the combined capacitive reactance of the sensor and the resistance of the resistor. This reduction in distortion occurs at frequencies greater than the corner frequency, i.e., the frequency which is equal to the inverse product of the capacitance in farads times the resistance in ohms, and is due to the high pass filter formed by the sensor and the resistor. Stated in terms of well known capacitor-resistor pole theory, the high-pass filter effect is based upon the "transducer capacitance-preamplifier input resistance pole" (i.e., such "pole" with reference to the capacitance characteristic of transducer 10, FIG. 1 and the preamplifier input resistance provided by CMOSFET I.C. device VCRs 14 and 16, FIG. 1). This distortion is less than that which would have been expected as a consequence of the non-linearity of prior art MOSFET VCRs. In actual practice, due to this high pass filter effect, the distortion rolls off at approximately 20 db/decade of frequency.

In the practice of the present invention, a stable control voltage is required, but the invention offers the capability of adjusting the input resistance after integrated circuit fabrication. If more than one decade of adjustability is required, an additional MOSFET VCR of different width over length ratio could be included. If additional linearity is required, the FET channel may be biased such that zero crossings do not occur.

While the present invention has been described in connection with what is presently considered to be the most practical and preferred embodiment, it is to be understood that the invention is not limited to the disclosed embodiment, but rather, is intended to cover various modifications and equivalent arrangements included within a spirit and scope of the appended claims.

What is claimed is:

1. Underwater sounds apparatus for the processing of acoustical signals comprising:

a capacitive sensor for transforming the acoustical signals to an electrical signal, said sensor having an impedance on the order of 10 to 1000 picofarads;

preamplifier means;

a first metal oxide semiconductor field effect transistor (MOSFET) connected to a first of a pair of input terminals of said preamplifier means, said transistor also being connected to an output of said sensor;

control signal generator means connected to said first MOSFET, said control signal generator means providing a selectively variable gate voltage which causes said MOSFET to operate in the triode region whereby the transistor is effectively a variable resistance, said first MOSFET being of one of the n-enhancement and p-enhancement types; and second and third MOSFETs of the other enhancement type with the second MOSFET having its source and back gate directly connected to said control signal generator and its gate connected to the gate of the first MOSFET with the third MOSFET having its drain connected to ground and its source and back gate connected to the gate of the first MOSFET, said second and third MOSFETs defining an active MOSFET linearization network to thereby enhance linearization of said first MOSFET's triode operation region, said first MOSFET, said linearization network, and said sensor mutually cooperating to provide a substantially distortionless high-pass filter at frequencies above the inverse product of the capacitance of said sensor and the resistance of said first MOSFET wherein said high-pass filter provides a distortion roll-off of approximately 20 db per decade of frequency at frequencies greater than said inverse product and distortion no greater than 0.014% at frequencies greater than said inverse product.

2. Underwater sound apparatus for the processing of acoustical signals comprising:

a capacitive sensor for transforming the acoustical signals to an electrical signal, said sensor having an impedance on the order of 10 to 1000 picofarads;

preamplifier means;

a first metal oxide semiconductor field effect transistor (MOSFET) connected to a first of a pair of input terminals of said preamplifier means, said transistor also being connected to an output of said sensor;

control signal generator means connected to said first MOSFET, said control signal generator means providing a selectively variable gate voltage which causes said MOSFET to operate in the triode region whereby the transistor is effectively a variable resistance, said first MOSFET being of one of the n-enhancement and p-enhancement types;

second and third MOSFETs of the other enhancement type with the second MOSFET having its source and back gate directly connected to said control signal generator and its gate connected to the gate of the first MOSFET with the third MOSFET having its drain connected to ground and its source and back gate connected to the gate of the first MOSFET, said second and third MOSFETs defining an active MOSFET linearization network to thereby enhance linearization of said first MOSFET's triode operation region, said first MOSFET, said linearization network, and said sensor mutually cooperating to provide a substantially distortionless high-pass filter at frequencies above the inverse product of the capacitance of said sensor and the resistance of said first MOSFET; and fourth, fifth and sixth MOSFETS, said fourth MOSFET being connected to a second of said pair of input terminals of said preamplifier means, said transistor also being connected to a second output of said sensor, said fourth MOSFET being of the aforesaid one of the n-enhancement and p-enhancement types, said fifth and sixth MOSFETs being of the other enhancement type with the fifth MOSFET having its source and back gate directly connected to said control signal generator and its gate connected to the gate of the fourth MOSFET with the sixth MOSFET having its drain connected to ground and its source and back gate connected to the gate of the fourth MOSFET, said fifth and sixth MOSFETs defining another active MOSFET linearization network wherein said second, third, fifth and sixth MOSFETs each have gate areas in the range between $1/100$th and $1/10$th of the area of the gate of said first and fourth MOSFETS, said first, second and third MOSFETs constituting a first unitary monolithic integrated circuit device and said fourth, fifth and sixth MOSFETs constituting a second unitary monolithic integrated circuit device.

* * * * *